(12) United States Patent
Phillips et al.

(10) Patent No.: US 6,641,743 B1
(45) Date of Patent: Nov. 4, 2003

(54) METHODS FOR FORMING WAVEGUIDES IN OPTICAL MATERIALS

(76) Inventors: Mark L. F. Phillips, 27468 Hayward Blvd., Hayward, CA (US) 94542; Travis P. S. Thoms, 16158 Via Media, San Lorenzo, CA (US) 94580

( * ) Notice: Subject to any disclaimer, the term of this patent is extended or adjusted under 35 U.S.C. 154(b) by 309 days.

(21) Appl. No.: 09/884,624

(22) Filed: Jun. 19, 2001

(51) Int. Cl.[7] .............................................. C30B 31/04
(52) U.S. Cl. .......................... 216/24; 216/41; 216/101; 423/594.8; 427/162
(58) Field of Search ........................ 216/24, 41, 101; 423/594.8; 427/162

(56) References Cited

U.S. PATENT DOCUMENTS

| | | | |
|---|---|---|---|
| 4,284,663 A | | 8/1981 | Carruthers et al. |
| 5,095,518 A | * | 3/1992 | Young et al. |
| 5,872,884 A | * | 2/1999 | Mizuuchi et al. |
| 6,519,077 B1 | * | 2/2003 | Mizuuchi et al. |

FOREIGN PATENT DOCUMENTS

| | | | | | |
|---|---|---|---|---|---|
| JP | 05173035 A | * | 7/1993 | ............ | G02B/6/12 |
| JP | 06235836 A | * | 8/1994 | ............ | C30B/29/30 |

OTHER PUBLICATIONS

Y. Korkishko et al., "LiNbO3 Optical Waveguide Fabrication by High–Temperature Proton Exchange", Journal of Lightwave Technology, vol. 18, No. 4, pp. 562–568, Apr. 2000.*

W. Chen et al., "Lithium Niobate Ridge Waveguides by Nickel Diffusion and Proton–Exchanged Wet Etching", IEEE Photonics Technology Letters, vol. 7, No. 11, pp. 1318–1320, Nov. 1995.*

A. Loni et al., "Proton–Exchanged LiNbO3 Waveguides: The Effects of Post–Exchange Annnealing and Buffered Melts ", Journal of Lightwave Technology, vol. 7, No. 6, pp. 911–919, Jun. 1989.*

S. Chen, et al., Hybrid Modes in Proton Exchanged Waveguides realized in LiNbO3, and Their Dependence on Fabrication Parameters, J. Lightwave Techn., 1994, pp. 862–71, vol. 12, No. 5, USA.

V.A. Federov, et al., Double Ion Exchange for High–Index waveguides in LiTaO3, Electronics Letters, 1992, pp. 1704–5, vol. 28, No. 18, United Kingdom.

V.A. Ganshin, et al., Deformations, Stresses and Birefringence in Proton–Exchanged Lithium Niobate Waveguides, J. Opt. Commun., 1992, pp. 2–7, vol. 13, No. 1, USA.

V.A. Ganshin, et al., Fabrication of Out–Diffused LiNbO3 Optical Waveguides at Low Temperatures in Molten Salts, Sov. Tech. Phys. Lett., 1983, vol. 9, No. 10, Soviet Union.

(List continued on next page.)

*Primary Examiner*—Robert Kunemund
*Assistant Examiner*—Terrence M Mackey

(57) ABSTRACT

A method for forming waveguides in an optical material such as lithium niobate comprises the steps of providing an exchange agent including a proton-supplying medium and a catalyst, and exposing a selected portion of the optical material to the exchange agent for a predetermined time and at a predetermined temperature. Preferably, the catalyst is a metallic cation having a valence of at least +2, and the proton-supplying medium is a weak acid with a pKa of greater than about 4.5 or a lithium-buffered ("starved") acidic solution. The catalyst accelerates the rate at which protons are exchanged with corresponding ions in the optical material lattice, thereby reducing the time required to produce a waveguide in the exposed portion of the optical material.

40 Claims, 5 Drawing Sheets

OTHER PUBLICATIONS

M. Goodwin, et al., Proton–Exchanged Optical Waveguides in Y–Cut Lithium Niobate, Electronics Letters, 1983, pp. 223–4, vol. 19, No. 6, United Kingdom.

P. Baldi, et al., Proton Exchanged Optical Waveguides in LiNbO3 and LiTaO3 for Integrated Lasers and Nonlinear Frequency Converters, Opt. Eng., 1998, pp. 1193–1202, vol. 37, No. 4, USA.

Y.N. Korkishko, et al., Relationship Between Refractive Indices and Hydrogen Concentration in Proton Exchanged LiNbO3 Waveguides, J. Appl. Phys., 1997, pp. 1010–17, vol. 82, No. 3, USA.

Y.N. Korkishko, et al., Crystal Structure and Optical Properties of (Li1–xZn2+x/2[]x/2)TaO3 Solid Solutions Obtained by Nonisovalent Ion–Exchange Method, Crystallography Reports 1995, pp. 449–59, vol. 40, No. 3, USA.

Y.N. Korkisho, et al., Relationships Between Structural and Optical Properties of Proton–Exchanged Waveguides on Z–cut Lithium Niobate, Applied Optics, 1996, pp. 7056–60, vol. 35, No. 36, USA.

Y.N. Korkishko, et al., Structural Phase Diagram of HxLi1–xNbO3 waveguides: The Correlation Between Optical and Structural Properties, IEEE Journal of Selected Topics in Quantum Electronics, 1996, pp. 187–96, vol. 2, No. 2, USA.

Y.N. Korkishko, et al., High–Index LiTaO3 Optical Waveguides with Controlling Birefringence Parepared by Nonisovalent Ion Exchange, Proceedings of the SPIE, 1994, pp. 345–54, vol. 2150, United Kingdom.

V.S. Ivanov, et al., Analysis of Ion Exchange Me:LiNbO3 and Cu: LiTaO3 Waveguides by AES, SAM, EPR and Optical Methods, Vacuum, 1992, pp. 317–24, vol. 43, No. 4, United Kingdom.

J. Rams, et al., Preparation of Proton–Exchange LiNbO3 Waveguides in Benzoic Acid Vapor, J. Opt. Soc. Am. B, 1999, pp. 401–6, vol. 16, No. 3, USA.

P.G. Suchoski, et al., Stable Low–Loss Proton–Exchanged LiNbO3 Waveguide Devices with No Electro–Optic Degradation, Optics Letters, 1988, pp. 1050–2, vol. 13, No. 11, USA.

T. Veng, et al., Dilute–Melt, Proton–Exchange Slab Waveguides in LiNbO3: A New Fabrication and Characterization Method, Applied Optics, 1997, pp. 5941–8, vol. 36, No. 24, USA.

T. Veng, et al., Second–Order Optical Nonlinearities in Dilute–Melt Proton Exchange Waveguides in Z–cut LiNbO3, Appl. Phys. Lett., 1996, pp. 2333–5, vol. 69, No. 16, USA.

* cited by examiner

METHODS FOR FORMING WAVEGUIDES IN OPTICAL MATERIALS

STATEMENT REGARDING FEDERALLY SPONSORED RESEARCH OR DEVELOPMENT

This invention was made with Government support under contract no. 5-R44-RR08674-03 awarded by the National Institutes of Health. The Government has certain rights in the invention

BACKGROUND OF INVENTION

The present invention relates generally to optical waveguides, and more particularly to methods for forming waveguides in optical substrate materials such as lithium niobate.

Techniques for fabricating optical waveguides in inorganic optical substrate materials include various methods in which a waveguide is formed by altering the index of refraction of selected portions of the substrate by ion exchange and diffusion. One well-known method of this type is the proton exchange (PE) method, used particularly on lithium niobate substrates and other crystalline materials. In. the PE method a proton-supplying exchange agent, such as benzoic acid or pyrophosphoric acid, is contacted with portions of the substrate surface, causing protons from the exchange agent to exchange with and replace some of the corresponding ions of the substrate material (e.g., lithium ions in a lithium niobate substrate) in a region near the surface of the substrate. The resulting proton-exchanged region has a higher refractive index, relative to the adjacent unaltered substrate material, for appropriately polarized light and thus can function as an optical waveguide. By selecting appropriate exchange agents and adjusting exchange conditions (and by use of a subsequent annealing step), a wide range of waveguide refractive index differences and depths can be achieved. The PE method advantageously enables relatively rapid formation of waveguides at low temperature (typically around 200° C.) conditions, whereas other ion exchange methods, such as titanium in-diffusion, generally require much higher temperatures to achieve equivalent rates of waveguide formation. A further advantage of the PE method is that waveguides formed by PE in materials such as lithium niobate are capable of maintaining the initial polarization state of the transmitted light, whereas waveguides formed by other techniques, such as titanium indiffusion, carry orthogonal polarizations at different velocities, resulting in a change of the state of polarization of the input optical energy (e.g., from linear to elliptical).

A disadvantage associated with the PE method is that the highly acidic exchange agents conventionally employed for proton exchange may produce undesirable effects, such as surface etching of the substrate and the formation of a "dead layer" (a disordered, centrosymmetric region with substantially reduced nonlinear or electro-optic properties) within the resultant waveguide. These undesirable effects may be minimized or avoided by using a weakly acidic exchange agent, or by using a lithium-buffered ("starved") exchange agent wherein a quantity of lithium ions are dispersed in the exchange agent. However, use of weakly acidic or starved exchange agents are known to reduce proton exchange rates substantially, requiring reaction times of tens or even hundreds of hours to form usable waveguides.

SUMMARY OF INVENTION

Roughly described, a method for forming waveguides in optical materials according to the present invention comprises the steps of providing an exchange agent including a catalyst and a proton-supplying medium, and exposing at least a portion of a surface of an optical material to the exchange agent for a specified period of time and at a specified temperature. The catalyst is selected to accelerate the rate of proton exchange in the exposed regions of the optical material, thereby shortening required exchange times and/or allowing the use of weakly acidic media in order to avoid or minimize the aforementioned problems associated with traditional highly-acidic exchange agents.

In accordance with specific aspects of the invention, the optical material comprises lithium niobate, the catalyst is selected from a group consisting of beryllium, magnesium, zinc and gadolinium ions, and the proton-supplying medium comprises an acid having a pKa greater than about 4.5 or a lithium-buffered ("starved") acidic solution. The catalyst may be added to the proton-supplying medium by dissolving therein an ionic salt (such as a chloride) of the catalyst. The position, geometry and dimensions of resultant waveguides may be controlled by masking appropriate regions of the optical material using techniques well known in the art and by adjusting the conditions at which the proton exchange step (and any subsequent annealing steps) are performed.

DETAILED DESCRIPTION

Figure 1:
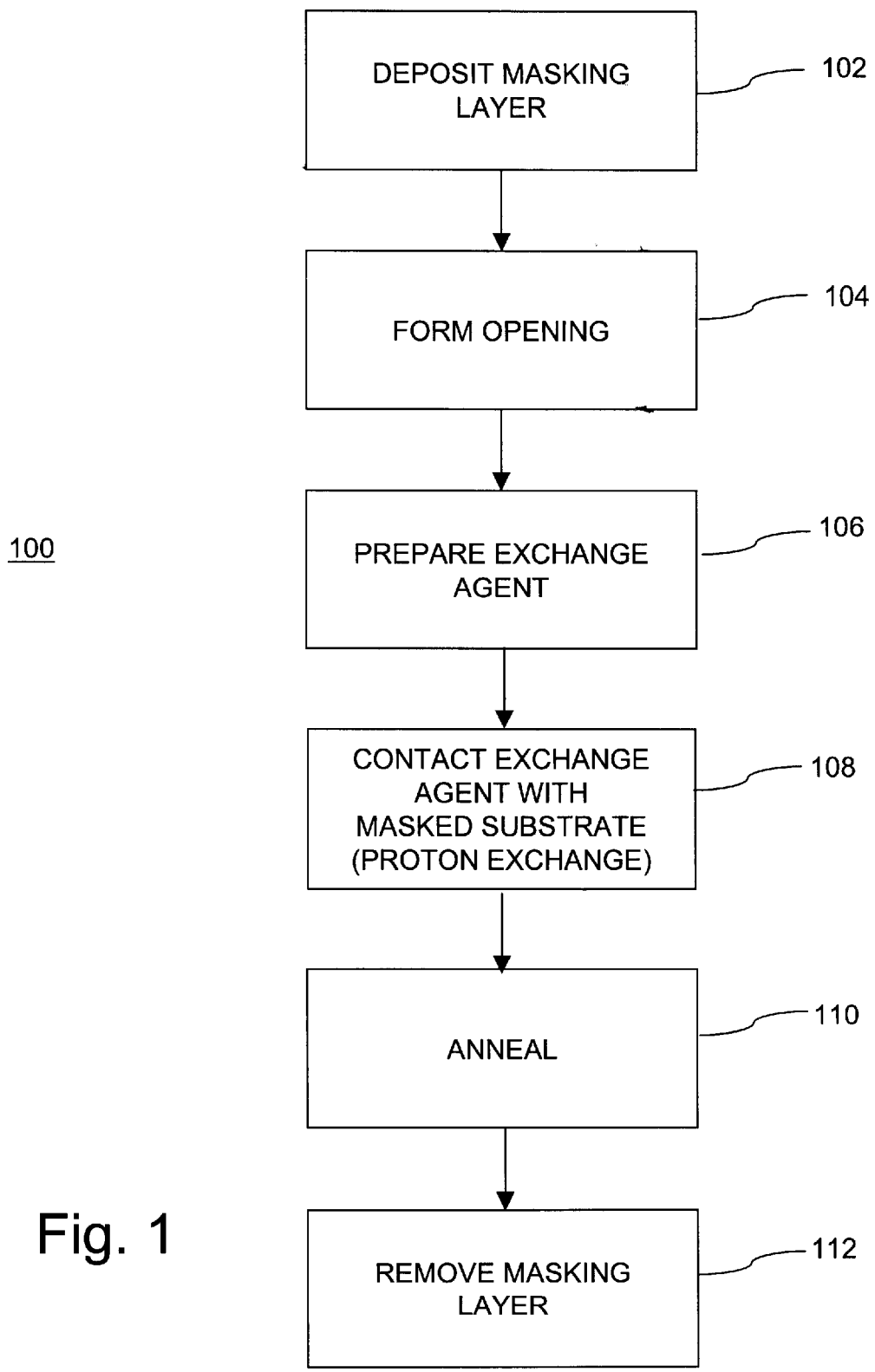
FIG. 1 is a flowchart depicting the steps of a method for forming a waveguide in an optical substrate, according to an embodiment of the present invention.
Figure 2:
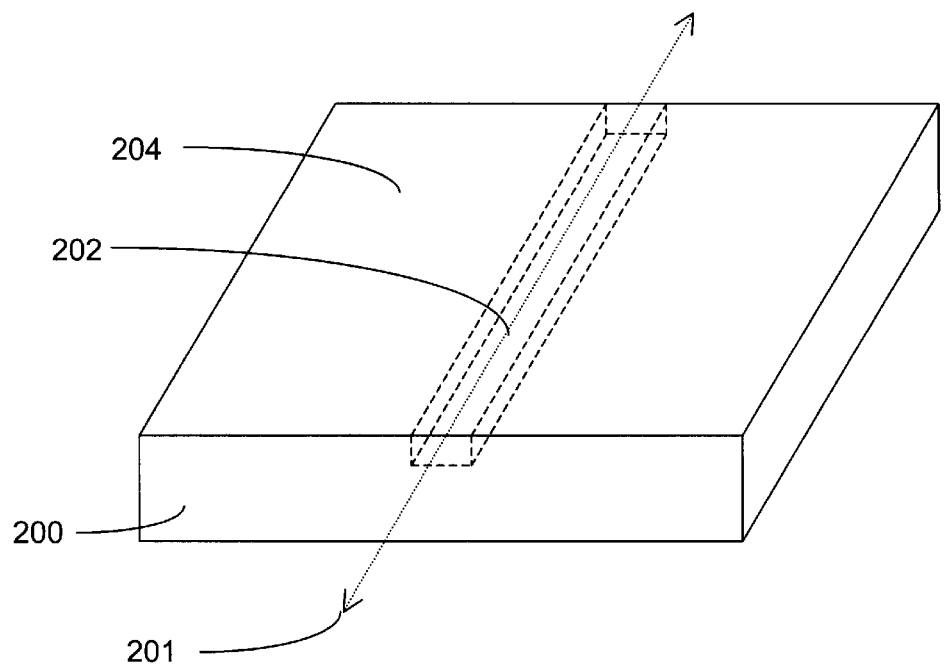
FIG. 2 is a perspective view of a substrate with an optical waveguide formed therein.

FIG. 1 is a flowchart depicting the steps of a catalyzed proton-exchange waveguide fabrication method (generally denoted as 100) of the invention. The method 100 will be described in the context of the formation of an optical waveguide 202 (having a light propagation axis indicated by an axis 201) in an exemplary optical material substrate 200, as shown in perspective view in FIG. 2 with the waveguide 202 depicted in phantom. As was discussed above, the waveguide 202 is defined by a region of the substrate 200 in which the refractive index has been altered by a proton-exchange reaction. Method 100 may be better understood with reference to FIGS. 3(a)–(c), which depict in perspective view substrate 200 at various stages during the formation of waveguide 202.

The substrate 200 will preferably comprise lithium niobate. The term "lithium niobate", as used herein, is intended to include both pure lithium niobate in its different compositional variations such as congruent and stoichiometric material, as well as lithium niobate doped with magnesium oxide, zinc oxide or other dopants that may be added for various purposes. Other optical materials which may be utilized in connection with method 100 include lithium tantalate ($LiTaO_3$) and lithium niobate-tantalate ($LiNb_{1-x}Ta_xO_3$)

Figure 3A:
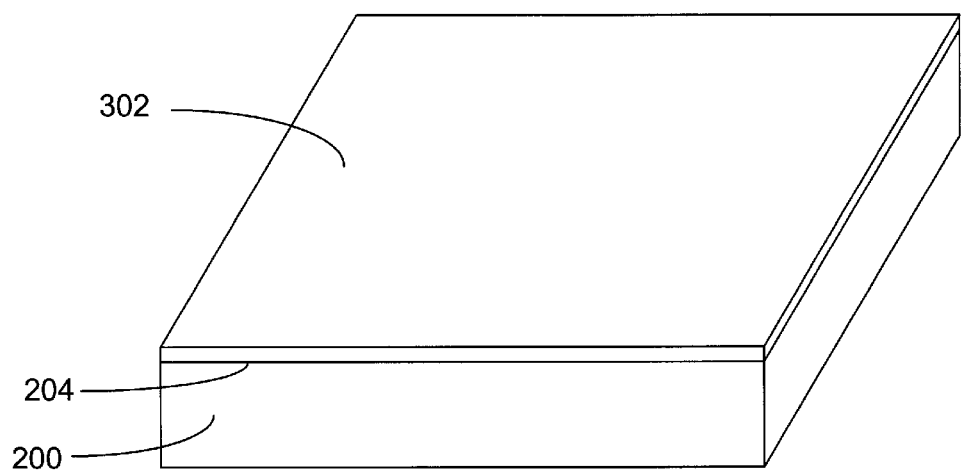
FIGS. 3a–3c are perspective views of the substrate depicting, at different stages of the method, the formation of an optical waveguide.

In the first step 102 of the method 100, a masking layer 302 is deposited on a surface 204 of the substrate 200. The masking layer will typically take the form of a layer of silicon dioxide deposited by a well-known technique such as sputtering, evaporation or spinning. The masking layer may alternatively comprise any refractory oxide, ceramic, metal, or other material that is stable at the conditions at which the proton exchange step is to be performed, does not react with the exchange agent, and prevents contact of the exchange agent with the surface 204. FIG. 3(a) shows the substrate 200 and masking layer 302 following completion of step 102.

In the next step 104, an opening 304 is formed in the masking layer to allow the underlying portion 306 of the surface 204 to be contacted by the exchange agent during the ion-exchange step. The shape and size of opening 304 are selected according to the desired shape and dimensions of the resultant waveguide 202. In the example depicted by FIG. 3(b), the opening 304 is generally rectangular in shape with a relatively narrow width (typically around 3–10 $\mu$m) such that a straight waveguide having a comparable width is formed. The opening 304 may be formed by one of a number of conventional techniques, such as but not limited to photolithography and etching (employing reactive ion etching or wet etching), photolithographic lift-off techniques, and laser ablation. It should be recognized that, if desired, a plurality of openings may be formed in the masking layer to enable fabrication of a corresponding plurality of waveguides.

Next, an exchange agent is prepared by adding a catalyst to a proton-supplying medium, step 106. Examples of substances which may be employed as the proton-supplying medium are presented below as Table I.

TABLE I

| Proton-Supplying Medium | pKa |
|---|---|
| Strong acids, e.g., $H_2SO_4$ | <<0 |
| Pyrophosphoric acid | 1.3 |
| Benzoic acid | 4.2 |
| Nonanoic acid | 4.9 |
| Aryl alcohols, e.g., 2-naphthol, resorcinol | 10 |
| Water | 15.5 |
| Glycerol | 18 |

It is noted that the examples listed above are intended as illustrative rather than limiting. As will be discussed in further detail below, it is generally preferable to a choose as the proton-supplying medium a relatively weak acid (an acid having a pKa greater than about 4.5, such as nonanoic acid) in order to avoid etching of the contacted portion of the surface 204. According to another implementation of the method 100, a glycerol/potassium hydrogen sulfate solution may be employed as the proton-supplying medium, with the concentration of potassium hydrogen sulfate being adjusted to provide a desired level of proton activity. In yet another implementation, a vapor-phase proton-supplying medium may be utilized.

It is noted that pure glycerol may be utilized in the absence of the catalyst to form dead-layer minimized waveguides in substrate materials, such as z-cut lithium niobate. However, such waveguide formation will proceed very slowly and may thus be commercially disfavored. It is further noted that nonanoic acid may be utilized in the absence of a catalyst to form waveguides in optical materials, including but not limited to z-cut lithium niobate.

The catalyst in the exchange agent is preferably a divalent or trivalent metal ion, such as beryllium ($Be^{2+}$), magnesium ($Mg^{2+}$), zinc ($Zn^{2+}$), or gadolinium ($Gd^{3+}$) The catalyst may be added to the proton-supplying medium as an ionic salt, such as a chloride (e.g., $BeCl_2$), which dissociates into the catalyst and the corresponding anion when dissolved in the proton-supplying medium. Other divalent or trivalent cations may be substituted for the aforementioned metal ions. The catalyst should be aliovalent with respect to (i.e., have a valence different than) the ions in the optical substrate lattice which are to be exchanged during the proton exchange process. In the current example, protons (hydrogen ions) will be exchanged with lithium ions (each having a valence of +1) in the lithium niobate substrate 200, whereas the catalyst will have a valence of +2 or +3. If required, the proton-supplying medium may be heated prior to the addition of the catalyst to bring the medium into a liquid state and/or to increase solubility of the catalysts therein.

For the purposes of the present invention, a material is considered to be a catalyst for the PE process if the addition of the catalyst produces a significant increase in the overall rate at which the PE process proceeds for a given set of conditions, but remains substantially unconsumed by the process. It will be recognized that the PE process may be regarded as comprising multiple individual processes or reactions, e.g., diffusion of protons into the substrate lattice, and diffusion of lithium ions out of the lattice, and that the catalyst may produce an overall acceleration of the PE process by accelerating one or more of the individual component processes.

The optimal catalyst concentration in the exchange agent will depend upon a number of process parameters, including the identity of the catalyst and proton-supplying medium, and the conditions at which the PE process is performed. For the process parameters described herein, it has been found that the concentration of catalyst in the exchange agent is preferably in the range of about 0.1–2.0 molar %. For these process parameters, catalyst concentrations below around 0.1 molar % are generally not effective in significantly accelerating the rate of proton exchange, whereas catalyst concentrations in excess of 2.0 molar % may produce an undesirably high proton concentration at the substrate surface.

Figure 3B:
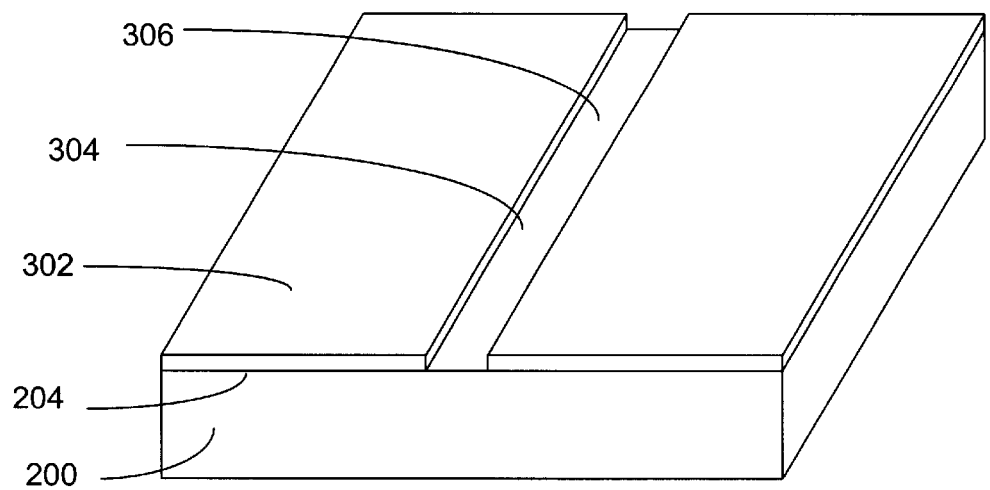
Figure 3C:
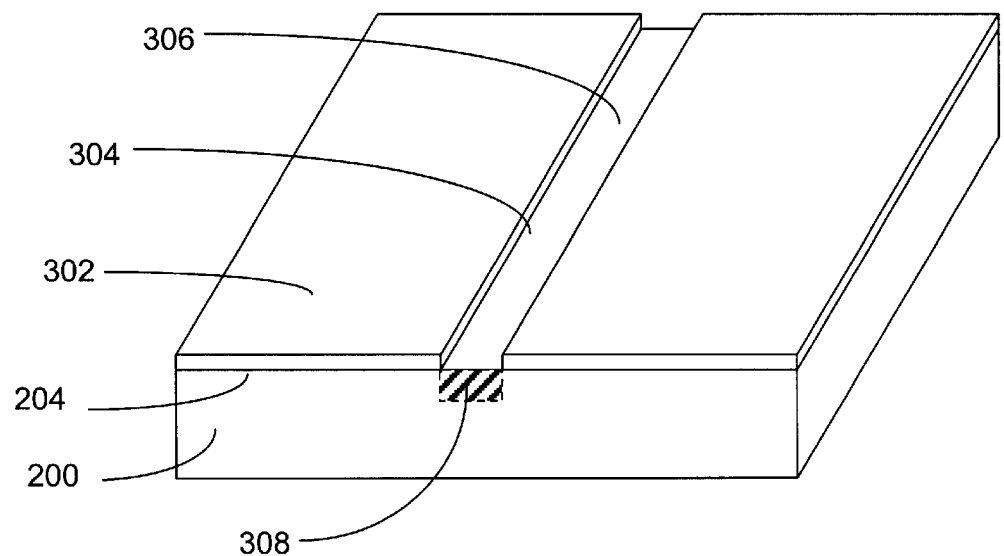

Following preparation of the exchange agent, at least a portion of the substrate 200 is submersed in the exchange agent to cause the portion 306 of the surface underlying the opening to be contacted by the exchange agent, step 108. The step 108 is performed at a predetermined exchange agent temperature $T_{ex}$ for a predetermined time duration $t_{ex}$. As will be discussed in further detail below and is depicted by FIG. 3(c), exposure of surface portion 306 to the protons contained in the exchange agent causes some of the lithium ions in a region 308 of the substrate 200 subjacent to the surface portion 306 to be exchanged with protons, thereby raising the refractive index of the substrate region 308 relative to the surrounding and unexposed regions of substrate 200. The presence of catalyst ions accelerates the rate at which the proton exchange reaction occurs, thereby reducing the $t_{ex}$ required to form a waveguide having a specified depth.

Figure 4:
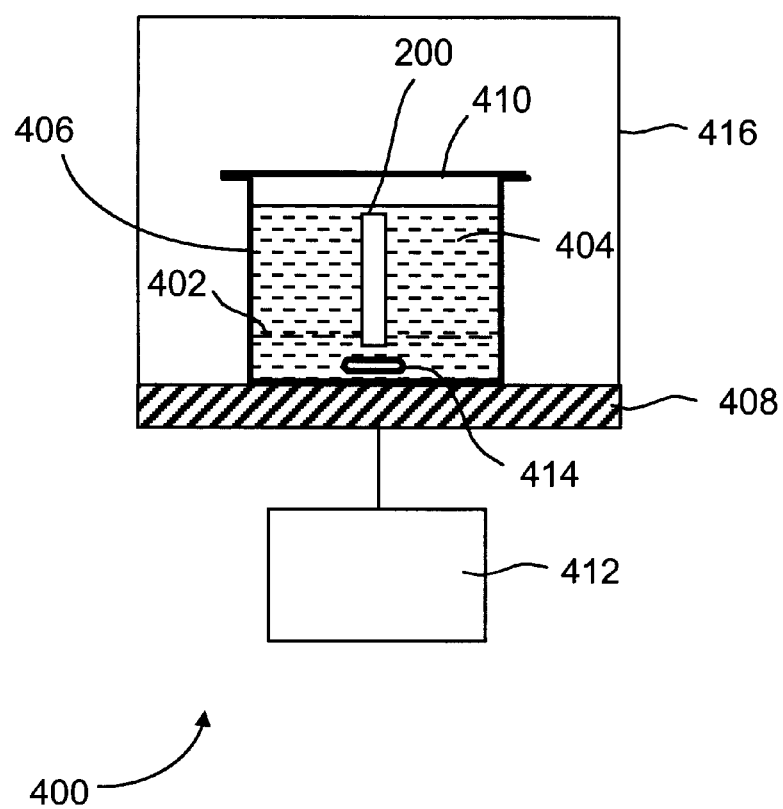
FIG. 4 is a block diagram showing an exemplary apparatus for implementing the waveguide formation method of the invention.

The catalyzed proton exchange step 108 can be accomplished in a conventional apparatus 400 schematically illustrated in FIG. 4. The substrate 200, provided with a masking layer 302 adapted with an opening 304 (as shown in FIGS. 3(b) and (c)) is shown held by a support frame 402 and submersed in a suitable volume of exchange agent 404. The exchange agent 404 is held within a container 406, which is disposed on and in good thermal contact with a heater 408. A lid 410 may be provided to reduce convective heat loss from the exchange agent 404. The temperature $T_{ex}$ of exchange agent 404 may be precisely controlled via a controller 412, which adjusts the amount of power supplied to the heater 408 responsive to measured temperature input (which may be supplied by a thermocouple or similar device located within the container 406. An induction stirrer 414, also actuated by the controller 412, may also be provided within the container 406. A substantially isothermal region is thus created in the exchange agent 404 surrounding the substrate 200. A shroud 416 may be disposed about the heater 408 and container 406 to reduce heat loss by convection and to reduce temperature gradients in the exchange agent. The junction between the shroud 416 and the heater 408 may be gas-tight to advantageously enable a non-oxidizing environment, such as nitrogen gas, to be included therein, which serves to prevent degradation of the exchange agent when substrate 200 is loaded and unloaded without full cool-down. The apparatus 400 depicted in FIG. 4 is presented by way of a non-limiting example, and those skilled in the art will recognize that the proton exchange step may be implemented using any number of different apparatuses.

The proton exchange time $t_{ex}$ and exchange agent temperature $T_{ex}$ are optimized according to a particular application to achieve a desired refractive index change and waveguide depth. In typical applications of the method 100, $t_{ex}$ will range from about 3 minutes to 48 hours, and $T_{ex}$ will range from about 140° C. to 280° C. During the proton exchange step 108, protons from the exchange agent diffuse into and lithium ions diffuse out of the surface 306 of substrate 200, so that a fraction of the lithium ions in a region 308, of the substrate 200 become exchanged with and replaced by protons via a combination of thermal motion and local electrical and/or electronic forces. The catalyst ions are not believed to penetrate the surface 306. X-ray fluorescence (XRF) testing of waveguides formed in a lithium niobate substrate using the catalyzed PE process described herein did not indicate that the catalyst ions are incorporated into the substrate lattice. This finding is in contradistinction to prior art double ion-exchange processes (such as that described by Korkishko and Federov in "Crystal Structure and Optical Properties of $(L_{1-x}Zn^{2+}_{x/2}[\ ]_{x/2})TaO_3$ Solid Solutions Obtained by Nonisovalent Ion-Exchange Method", Crystallography Reports, Vol. 40, No. 3, pp. 493–504 (1995)), wherein metallic ions added to the exchange solution are incorporated into the resultant waveguide and thus serve as reactants rather than as catalysts.

In any event, the catalyst accelerates the proton exchange process within the region of the substrate 200 proximal the surface 306 thereof, thus producing a desired depth of waveguide in a shorter $t_{ex}$ at a given $T_{ex}$ than would be required using a conventional PE process without catalyst at substantially the same temperature.

Alternatively explained, if substantially similar temperature and time duration are employed, the presence of the catalyst produces a waveguide depth greater than that attained by a conventional PE process.

TABLE II

| Experiment | Proton-Supplying Medium | Catalyst | Molar % | Tex (° C.) | tex (hours) | Δn | Mode Depth (μm) |
|---|---|---|---|---|---|---|---|
| A | Benzoic acid w/ lithium salt | Be$^{2+}$ | 0.63 | 275 | 30 | 0.1 | 2.8 |
| A | Benzoic acid w/ lithium salt | None | | 275 | 30 | 0.04 | 1.2 |
| B | Benzoic acid w/ silicone oil | Be$^{2+}$ | Trace | 250 | 40 | 0.11 | 1.0 |
| B | Benzoic acid w/ silicone oil | None | | 250 | 40 | 0.01 | — |
| C | 2-Naphthol | Be$^{2+}$ | 0.51 | 230 | 18 | 0.1 | 1.7 |
| C | 2-Naphthol | None | | 230 | 18 | 0.01 | — |
| D | Glycerol | Mg$^{2+}$ | 1.80 | 180 | 23 | 0.1 | 1.3 |
| D | Glycerol | None | | 180 | 23 | — | — |

The effect of catalyst addition on the properties of waveguides formed by a proton-exchange method is demonstrated by Table II above, which summarizes a set of four experiment pairs (labeled A–D). In the first experiment of each pair, a substrate of undoped Z-cut lithium niobate material is exposed to a catalyzed exchange agent (comprising a catalyst mixed with a proton-supplying medium at a given temperature $T_{ex}$ and for a given time $t_{ex}$. In the second experiment of each pair, proton exchange is performed using substantially identical parameters (i.e., same substrate material, proton-supplying medium, $T_{ex}$ and $t_{ex}$) but without addition of a catalyst to the proton-supplying medium. Each experiment pair utilizes a unique combination of proton-supplying medium, catalyst, and exchange temperature/time conditions.

Following completion of the proton exchange step in each experiment, two properties of the resultant waveguide were measured for propagation of a TM mode: refractive index increase (Δn) and optical mode depth (which is representative of the waveguide depth with respect to the adjacent substrate surface). The prism coupling method of measurement at a wavelength of 633 nanometers was employed to obtain the mode indices of a planar waveguide section and extended by inverse WKB analysis to obtain an index profile and optical mode depth, as known in the art, and was further extended by two-dimensional analysis to derive the aforementioned properties of Δn and mode depth. The measured waveguide properties are listed for each experiment in the rightmost two columns of Table I.

The results for all experiment pairs A–D clearly show that waveguide formation via the proton exchange process is accelerated by the addition of a catalyst. In each case, greater refractive index increases and mode depths are achieved when the proton exchange is performed with a catalyst. In experiment pair A, for example, a waveguide having a Δn=0.1 and a mode depth of 2.8 μm was produced by proton exchange conducted in the presence of a Be$^{2+}$ catalyst, whereas considerably diminished waveguide properties (Δn=0.01 and mode depth=1.2 μm) were achieved by proton exchange conducted under identical conditions, but without the catalyst. Similarly, uncatalyzed proton exchange performed in experiment pairs B–D did not produce waveguides having measurable mode depths, whereas proton exchange performed with a catalyst produced waveguides having mode depths of 1.0, 1.7, and 1.3 μm, respectively.

Following completion of the proton exchange step 108, substrate 200 may be annealed to provide desired waveguide characteristics, step 110. The annealing step 110 may be implemented by removing the substrate 200 from contact with the exchange agent, uniformly heating the substrate 200 to an elevated temperature (preferably within the range 300 to 400° C.), and maintaining the substrate 200 at the elevated temperature for a specified period. The annealing step 110 may be performed in air or, alternatively, in an inert gas atmosphere. The masking layer 302 preferably remains in contact with the substrate surface during the annealing step, but may alternatively be removed prior to annealing without substantially affecting the process. The time and particular temperature of annealing are chosen according to the desired waveguide characteristics, and for shallow waveguides the annealing step 110 can be omitted. The process of annealed proton exchange(APE), comprising proton exchange followed by annealing, is generally known in the art and is described, for example, by P. G. Suchoski et al. in "Stable low-loss proton-exchanged LiNbO3 waveguide devices with no electro-optic degradation," Optics Letters, Vol. 13, No. 11, November 1988, pp. 1050–1052. Annealing is known to produce two primary effects: first, it increases waveguide 202 depth by driving the protons that were placed in the region 308 of substrate 200 during step 108 deeper into the substrate 200; and second, it reduces proton concentration, so that the normal electro-optical and nonlinear optical properties of the substrate 200 are preserved in the portion of waveguide 202 positioned below region 308 (the region in which proton exchange is effected during step 108), even if a dead layer exists in region 308. It is noted that the annealing step 110 does not remove a dead layer created during the proton exchange step 108, but rather produces an index-altered region having normal electro-optical and nonlinear optical properties below the dead layer, thereby forming a waveguide 202 which is suitable for many applications.

In the final step 112 of the waveguide fabrication method 100, the masking layer 302 is removed from substrate 200. Removal of the masking layer 302 may be accomplished using a suitable etchant or solvent, or by an alternate technique known in the art, such as ion milling or reactive ion etching (RIE).

The catalyzed PE method 100 described above may be particularly useful in cases where the use of a highly acidic exchange agent is disfavored. One such case is formation of waveguides in Y-cut lithium niobate. The PE (and APE) waveguide fabrication process on lithium niobate substrates with Y-cut surface orientation is known in the art (as described, for example, by M. Goodwin and C. Stewart in "Proton exchanged optical waveguides in Y-cut lithium niobate," Electronics Letters Vol. 19, 1983, pp. 223–224) but has not been successfully employed for commercial manufacturing, because the acids typically used as exchange agents tend to etch the substrate surface. The surface etching problem can be avoided or minimized by using an exchange agent having a pKa >4.5, preferably nonanoic acid, or alternatively another substance listed in Table 1 hereinabove, such as 2-naphthol, water, or glycerol. Undesirable surface etching may alternatively be avoided by addition of lithium salt to the exchange agent (for example addition of less than 2 weight % of lithium benzoate to benzoic acid) to create a "starved" exchange agent, as known in the art and particularly described by T. Veng and T. Skettrup in "Dilute-melt, proton-exchange slab waveguides in LiNbO$_3$," Applied Optics, Vol. 36, No. 24, August 1997, pp. 5941–5948; and by Y. N. Korkishko and V. A. Fedorov in "Structural phase diagram of H$_x$Li$_{1-x}$NbO$_3$ waveguides: the correlation between optical and structural properties," IEEE Journal of Selected Topics in Quantum Electronics, Vol. 2, No. 2, June 1996, pp. 187–196). However, as noted above, the proton exchange reaction proceeds unacceptably slowly when a weak acid or starved exchange agent is used, requiring exchange times of hundreds or even thousands of hours to produce a useful waveguide. By adding a catalyst to the exchange agent, the proton exchange reaction rate is accelerated by an amount sufficient to enable waveguide formation within a time period suitable for commercial manufacturing purposes.

The use of the catalyzed proton exchange method 100 described above may also be advantageous for applications where the formation of a dead layer in the resultant waveguide needs to be avoided or at least minimized. Prior art PE processes, which typically utilize medium or strong acids for the exchange agent, frequently create a heavily protonated region near the substrate surface. A substantial portion of this heavily protonated region is a dead layer, which lacks desired optical and electro-optical properties. The dead layer is thought to be a region of excessively hydrogen-rich lithium niobate that is a disordered crystalline region, or a region with a centrosymmetric crystal structure (β-phase), different from the normal non-centrosymmetric (congruent or stoichiometric, α-phase) lithium niobate that is stable only up to a certain limit of hydrogen fraction × (of hydrogen plus lithium atoms), such as ×=0.12.

It is known in the art that dead-layer formation in a waveguide formed by proton exchange in lithium niobate may be avoided by employing a starved exchange agent (an exchange agent comprising a proton-supplying medium having a quantity of a lithium salt added thereto). Lithium salt addition is believed to eliminate the dead layer by lowering the surface fraction of hydrogen by a degree sufficient to prevent a disordered crystalline region or β-phase from forming during the proton-exchange process. The resulting optical waveguide has normal electro-optical and nonlinear properties extending substantially to the substrate surface. This condition (i.e., avoidance or minimization of dead layer formation) advantageously provides enhanced optical mode confinement in surface waveguides, and further enables poling of the substrate material near the surface thereof to achieve efficient frequency doubling or similar functionality. As noted hereinabove, starved exchange agents are not generally suitable for commercial manufacturing applications due to the very long exchange times required to form waveguides having useful characteristics. The addition of a catalyst to the starved exchange agent, in accordance with the teaching of the present invention, substantially reduces required exchange times and may thereby enable commercial manufacturing of waveguides free of a dead layer.

Figure 5:
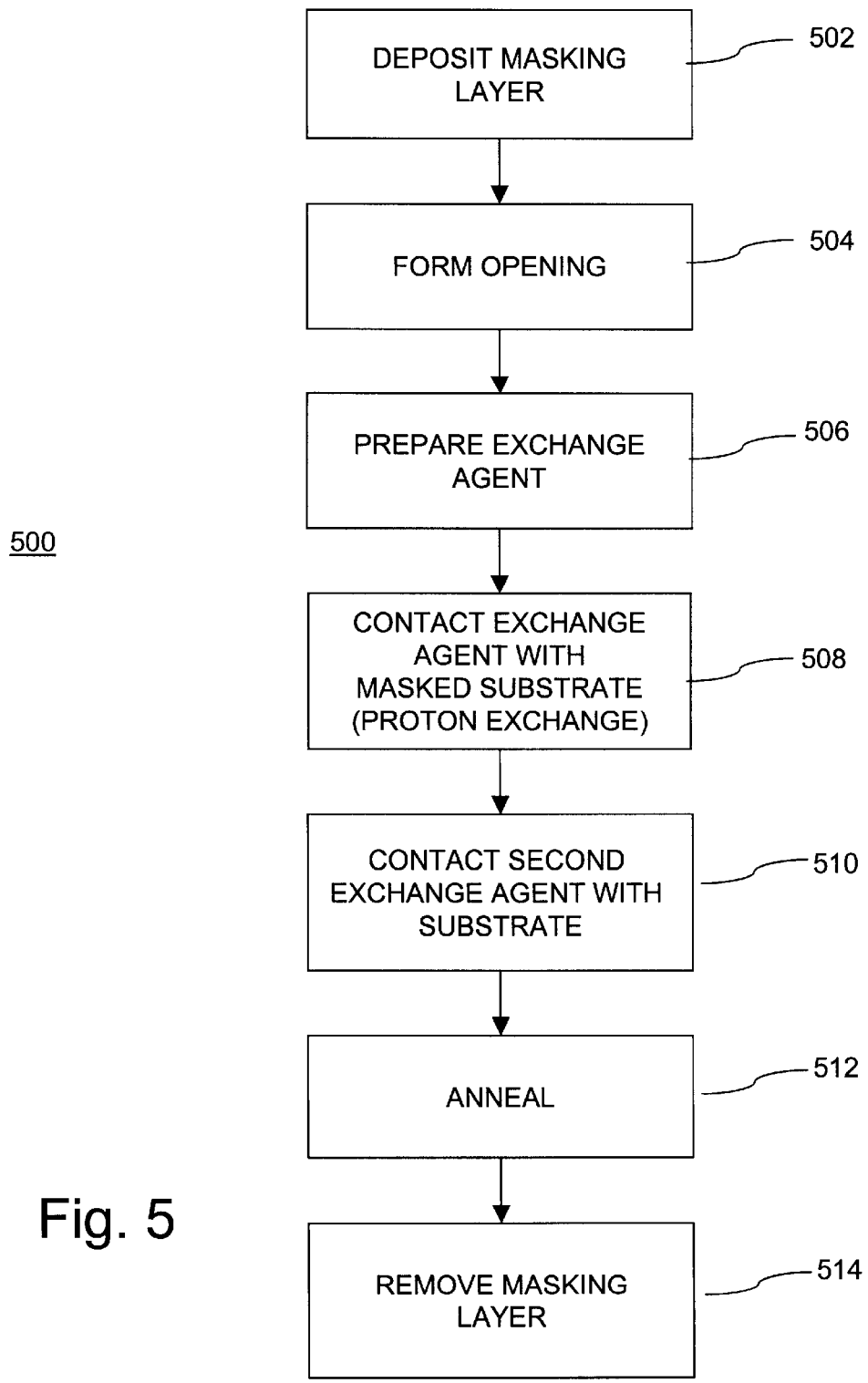
FIG. 5 is a flowchart depicting the steps of a method for forming a waveguide in an optical substrate, according to a second embodiment of the present invention.

FIG. 5 depicts the steps of a method 500 for forming waveguides in optical materials according to a second embodiment of the invention. It is known that in some optical substrates, such as lithium tantalate (LiTaO$_3$), the proton exchange process produces a smaller Δn than is obtainable in lithium niobate, thereby yielding waveguides having a lesser degree of confinement. A double ion exchange process, using non-isovalent metal ions and protons concurrently supplied from a molten salt solution to exchange with lithium ions in the substrate lattice, has been employed in the prior art to fabricate optical waveguides with larger Δn in lithium tantalate substrates(on Z-, X- and Y-cut surface orientations) than is achievable using a conventional proton-exchange process. Examples of double ion exchange processes of the foregoing description are described by V. A. Fedorov, Y. N. Korkishko, and T. V. Morozova in "High-index LiTaO₃ optical waveguides with controlling birefringence prepared by nonisovalent ion exchange," *Proceedings of SPIE*, vol. 2150 (1994), pp. 345–354; and by V. A. Ganshin, V. A. Fedorov, Y. N. Korkishko, and T. V. Morozova in "Double ion exchange for high-index waveguides in LiTaO₃, "*Electronics Letters*, vol. 28 (1992) pp. 1704–1705. The method 500 of the present invention utilizes a different approach, wherein a catalyzed proton exchange process and an ion exchange or indiffusion process are performed in sequence.

In the first step 502 of the method 500, a masking layer is deposited on a surface of the substrate, preferably by sputtering, evaporation or spinning. The masking layer may comprise any suitable refractory oxide, ceramic, metal, or other material that is stable at the conditions at which the proton-exchange and indiffusion/ion exchange steps are to be performed, does not react with the exchange agents, and prevents contact of the exchange agent with the substrate surface. An opening corresponding to the desired waveguide width and shape is then formed in the masking layer, step 504, in a manner similar to that described above in connection with FIG. 1.

Next, in steps 506 and 508, a catalyzed proton exchange agent is prepared and the optical material substrate is exposed to the exchange agent at a specified temperature and for a specified time, which are preferably in the range 140–280° C. and 3 minutes-48 hours, respectively. The catalyzed exchange agent may be a proton-supplying medium/metallic ion catalyst mixture of the type described above in connection with FIG. 1, the proton-supplying medium preferably comprising 2-naphthol and the catalyst preferably comprising beryllium, magnesium, zinc, or gadolinium ions. An apparatus of the type depicted in FIG. 4 and described above may be utilized for step 508. After the substrate has been exposed to the catalyzed exchange agent for the specified period, it is removed and cleaned to remove any residual exchange agent.

The substrate is then exposed to a second exchange agent for a specified time and at a specified temperature to effect the metal indiffusion or ion exchange reaction in the unmasked portion of the substrate, step 510. The second exchange agent will comprise titanium or other metallic element capable of diffusing into the substrate and producing a refractive index change. Metal indiffusion in materials such as lithium niobate and lithium tantalate is well known in the art (see, for example, U.S. Pat. No. 4,284,663 to Carruthers et al.), and generally requires temperatures in the range 800–1100° C. and time durations in the range of 2–8 hours to create useful waveguides. Use of a prior proton exchange step 508 per the present invention advantageously causes metal indiffusion or ion-exchange to proceed significantly more rapidly, thereby allowing either a shorter time or a lower temperature to be used to accomplish metal indiffusion to the desired depth. After the specified time for the indiffusion step has elapsed, the substrate is removed from the second exchange agent and cleaned.

Next, the substrate is optionally annealed, step 512, at a specified temperature and for a specified time, in a manner similar to that discussed above in connection with FIG. 1. The masking layer is preferably kept on the substrate during annealing, but it may alternatively be removed prior to annealing. Annealing may serve to reduce the concentration of metal atoms or ions in a region of the substrate near its surface, and also to drive the metal atoms somewhat deeper into the substrate.

In the final step 514 of the method 500, the masking layer is removed by utilization of a suitable etchant or solvent, or alternatively by employing RIE (reactive ion etching), or laser ablation.

It will be recognized by those skilled in the art that, while the invention has been described above in terms of preferred embodiments, it is not limited thereto. Various features and aspects of the above described invention may be used individually or jointly. Further, although the invention has been described in the context of its implementation in a particular environment and for particular applications, e.g., formation of waveguides in lithium niobate substrates, those skilled in the art will recognize that its usefulness is not limited thereto and that the present invention can be beneficially utilized in any number of environments and implementations. Accordingly, the claims set forth below should be construed in view of the full breadth and spirit of the invention as disclosed herein.

What is claimed is:

1. A method for forming waveguides in an optical material, comprising the steps of:
   providing an exchange agent including a proton-supplying medium and a catalyst selected to accelerate the overall rate at which a proton exchange process proceeds in said optical material; and
   exposing a selected portion of said optical material to said exchange agent for a specified time and at a specified temperature.

2. The method of claim 1, wherein said catalyst comprises metallic cations having a valence of at least +2.

3. The method of claim 2, wherein said catalyst is selected from a group consisting of beryllium ions, magnesium ions, zinc ions and gadolinium ions.

4. The method of claim 3, wherein the catalyst is beryllium ions.

5. The method of claim 3, wherein the catalyst is magnesium ions.

6. The method of claim 3, wherein the catalyst is zinc ions.

7. The method of claim 3, wherein the catalyst is gadolinium ions.

8. The method of claim 1, wherein the proton-supplying medium has a pKa of greater than about 4.5.

9. The method of claim 1, wherein the proton-supplying medium comprises nonanoic acid.

10. The method of claim 1, wherein the proton-supplying medium comprises 2-naphthol.

11. The method of claim 1, wherein the molar concentration of the catalyst in the exchange agent is between 0.1 and 2.0 percent.

12. The method of claim 1, further comprising the step of annealing said optical material following the exposing step.

13. The method of claim 1, wherein said specified temperature is about 250° C.

14. The method of claim 1, wherein the step of providing an exchange agent includes the step of dissolving an ionic salt in the proton-supplying medium.

15. The method of claim 1, wherein the step of exposing includes the step of masking a surface of the optical material to define said selected portion.

16. The method of claim 1, wherein the optical material is lithium niobate.

17. An exchange agent for fabricating waveguides in optical materials by proton exchange, comprising:
   a proton-supplying medium; and
   a catalyst selected to accelerate the overall rate at which a proton exchange process proceeds in said optical materials.

18. The exchange agent of claim 17, wherein the proton-supplying medium has a pKa greater than about 4.5.

19. The exchange agent of claim 17, wherein the proton-supplying medium comprises nonanoic acid.

20. The exchange agent of claim 17, wherein the proton-supplying medium comprises 2-naphthol.

21. The exchange agent of claim 17, wherein the proton-supplying medium comprises a lithium ion containing acid.

22. The exchange agent of claim 17, wherein said catalyst comprises metallic cations having a valence of at least +2.

23. The exchange agent of claim 22, wherein said catalyst is selected from a group consisting of beryllium ions, magnesium ions, zinc ions and gadolinium ions.

24. The exchange agent of claim 22, wherein the catalyst is beryllium ions.

25. The exchange agent of claim 22, wherein the catalyst is magnesium ions.

26. The exchange agent of claim 22, wherein the catalyst is zinc ions.

27. The exchange agent of claim 22, wherein the catalyst is gadolinium ions.

28. A method of forming a waveguide in an optical material, comprising the steps of:
   providing an exchange agent including a proton-supplying medium and a catalyst selected to accelerate the overall rate at which a proton exchange process proceeds in said optical material;
   exposing a selected portion of said optical material to said exchange agent for a specified time and at a specified temperature, and
   subsequently exposing said selected portion to a second exchange agent for a second specified time and at a second specified temperature.

29. The method of claim 28, wherein said second exchange agent comprises titanium.

30. The method of claim 28, wherein said proton-supplying medium has a pKa of greater than about 4.5.

31. The method of claim 28, wherein said optical material is lithium tantalate.

32. The method of claim 28, wherein said catalyst is a metallic cation having a valence of at least +2.

33. The method of claim 32, wherein the catalyst is selected from a group consisting of beryllium ions, magnesium ions, zinc ions and gadolinium ions.

34. A method for forming a dead layer-minimized waveguide in a lithium niobate substrate, comprising the steps of:
   providing an exchange agent including a relatively weakly acidic proton-supplying medium and a catalyst, said catalyst comprising metallic cations having a valence of at least +2; and
   exposing a selected portion of said substrate to said exchange agent for a specified time and at a specified temperature.

35. The method of claim 1, wherein the proton-supplying medium comprises a lithium ion containing acid.

36. A method for forming waveguides in an optical material, comprising the steps of:
   (a) exposing a selected portion of said optical material to an exchange agent including nonanoic acid for a first specified time and at a first specified temperature; and
   (b) subsequent to step (a), annealing said optical material for a second specified time and at a second specified temperature.

37. The method of claim 36, wherein said step of exposing includes a step of masking a surface of said optical material to define said selected portion.

38. The method of claim 36, wherein said optical material is lithium niobate.

39. The method of claim 36, wherein said optical material is Z-cut lithium niobate.

40. The method of claim 36, wherein said exchange agent is pure nonanoic acid.

* * * * *